(12) United States Patent
Zhao et al.

(10) Patent No.: US 10,598,852 B1
(45) Date of Patent: Mar. 24, 2020

(54) DIGITAL-TO-ANALOG CONVERTER (DAC)-BASED DRIVER FOR OPTICAL MODULATORS

(71) Applicant: Xilinx, Inc., San Jose, CA (US)

(72) Inventors: Hai bing Zhao, Singapore (SG); Kee Hian Tan, Singapore (SG); Ping-Chuan Chiang, Yilan (TW); Yipeng Wang, Singapore (SG); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/425,009

(22) Filed: May 29, 2019

(51) Int. Cl.
| G09G 3/36 | (2006.01) |
| G02B 6/12 | (2006.01) |
| H03M 1/50 | (2006.01) |
| G02B 6/42 | (2006.01) |

(52) U.S. Cl.
CPC ....... *G02B 6/12007* (2013.01); *G02B 6/4201* (2013.01); *G09G 3/3685* (2013.01); *H03M 1/50* (2013.01); *G09G 2310/027* (2013.01)

(58) Field of Classification Search
CPC .............. G02B 6/12007; G02B 6/4201; G02B 2310/027; G09G 3/3685; H03M 1/50; H03M 1/66
USPC ........................................................ 398/183
See application file for complete search history.

(56) References Cited

U.S. PATENT DOCUMENTS

| 6,225,992 | B1* | 5/2001 | Hsu ...................... G09G 3/3696 327/544 |
| 9,929,741 | B1* | 3/2018 | Hsia ...................... H03M 1/742 |
| 2009/0109204 | A1* | 4/2009 | Aoki .................... G09G 3/3614 345/211 |
| 2012/0182162 | A1* | 7/2012 | Currivan ................. H04B 1/10 341/51 |
| 2013/0154860 | A1* | 6/2013 | Schell ................ H03M 1/1061 341/118 |
| 2016/0125820 | A1* | 5/2016 | Ito ........................ G09G 3/3685 |
| 2017/0257171 | A1* | 9/2017 | Welch ................ H04L 25/0272 |
| 2019/0199439 | A1* | 6/2019 | Zuo ......................... H04L 27/26 |

\* cited by examiner

*Primary Examiner* — Dalzid E Singh
(74) *Attorney, Agent, or Firm* — William Paradice (57) ABSTRACT

A data driver includes pre-driver circuitry coupled to a digital-to-analog converter (DAC) via a plurality of bit lines. The pre-driver circuitry is configured to receive a plurality of first voltages corresponding to respective bits of a digital codeword. Each of the first voltages may have one of a first voltage value or a ground potential based on a value of the corresponding bit. The pre-driver circuitry is further configured to drive a plurality of second voltages onto the plurality of bit lines, respectively, by switchably coupling each of the bit lines to ground or a voltage rail based at least in part on the voltage values of the plurality of first voltages. The voltage rail provides a second voltage value that is greater than the first voltage value. The DAC converts the plurality of second voltages to an electrical signal which is an analog representation of the digital codeword.

20 Claims, 9 Drawing Sheets

DIGITAL-TO-ANALOG CONVERTER (DAC)-BASED DRIVER FOR OPTICAL MODULATORS

TECHNICAL FIELD

Aspects of the present disclosure generally relate to integrated circuits (ICs), and specifically to DAC-based drivers for optical modulators used in photonic ICs.

BACKGROUND

A photonic integrated circuit (IC) utilizes optical communications to provide high speed data transfers (e.g., 112 Gbps using PAM4 signaling) between on-chip circuitry. To take advantage of the increased bandwidth afforded by an optical communication medium, the photonic IC may first need to convert binary input data from the electrical domain to the optical domain. More specifically, an electrical transmitter may generate an electrical signal based on the binary input data (e.g., using various signal modulation techniques) and an electro-optic modulator (EOM) may convert the electrical signal to a corresponding optical signal. The optical signal is then transmitted, over an optical communication medium (e.g., optical fiber), to an optical receiver which converts the optical signal back to an electrical signal to recover the binary input data.

The EOM produces the optical signal by encoding the input data onto an optical carrier (e.g., by modulating the amplitude or phase of light). Thus, the EOM may be a directly-modulated laser (DWL) or an external modulator coupled to a light source (e.g., continuous-wave laser or light-emitting diode). Examples of external modulators may include ring modulators (RMs) and electro-absorption modulators (EAMs). A modulator may include a waveguide to receive and modulate the optical carrier. For example, using the electro-optic effect, the modulator may modulate the amplitude (e.g., intensity) of the optical carrier by using an external electric field (e.g., corresponding to the electrical signal) to alter the refractive index of the waveguide. The change in refractive index is proportional to the electrical field.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to data drivers and methods of their operation. A data driver includes pre-driver circuitry and a digital-to-analog converter (DAC). The pre-driver circuitry is configured to receive a plurality of first voltages corresponding to respective bits of a digital codeword and drive a plurality of second voltages onto respective bit lines by switchably coupling each of the bit lines to ground or a voltage rail based at least in part on the voltage values of the plurality of first voltages. Each of the first voltages may have one of a first voltage value ($V_{DD1}$) or a ground potential based on a value of the corresponding bit. Further, the voltage rail may be configured to provide a second voltage value ($V_{DD2}$) that is greater than the first voltage value. In some aspects, the second voltage value may be double the first voltage value. The DAC is coupled to the bit lines and configured to convert the plurality of second voltages to an electrical signal. For example, the electrical signal may be an analog representation of the digital codeword. In some implementations, the electrical signal may be a single-ended signal having a voltage swing greater than the first voltage value.

In some implementations, the pre-driver circuitry may be configured to ground one or more of the bit lines in response to receiving a corresponding one or more of the first voltages at the ground potential. Further, the pre-driver circuitry may be configured to couple one or more of the bit lines to the voltage rail in response to receiving a corresponding one or more of the first voltages at the first voltage value. In some aspects, one or more most significant bits (MSBs) of the digital codeword are thermometer coded. In some other aspects, one or more least significant bits (LSBs) of the digital codeword are binary coded.

In some implementations, the pre-driver circuitry may comprise a plurality of slices configured to receive the plurality of first voltages, respectively. Each of the slices is coupled to a respective one of the bit lines and comprises a level shifter, a first switch, and a second switch. The level shifter is configured to generate a level-shifted (LS) voltage based on the received first voltage. The LS voltage may have one of the first voltage value or the second voltage value depending on the voltage value of the first voltage. The first switch is configured to switchably couple the respective bit line to the voltage rail based on the voltage value of the LS voltage. The second switch is configured to switchably couple the respective bit line to ground based on the voltage value of the first voltage.

In some aspects, the level shifter may drive the LS voltage to the first voltage value when the first voltage is at the ground potential, and may drive the LS voltage to the second voltage value when the first voltage is at the first voltage value. In some aspects, the first switch may couple the respective bit line to the voltage rail when the LS voltage is at the second voltage value, and may decouple the respective bit line from the voltage rail when the LS voltage is at the first voltage value. In some aspects, the second switch may couple the respective bit line to ground when the first voltage is at the ground potential, and may decouple the respective bit line from ground when the first voltage is at the first voltage value. Accordingly, the second voltage is driven to the second voltage value ($V_{DD2}$) when the first voltage is at the first voltage value ($V_{DD1}$).

An example method of digital-to-analog conversion is also disclosed. The method may include receiving a plurality of first voltages corresponding to respective bits of a digital codeword, where each of the first voltages has one of a first voltage value or a ground potential based on a value of the corresponding bit; driving a plurality of second voltages onto respective bit lines by switchably coupling each of the bit lines to ground or a voltage rail based at least in part on the voltage values of the plurality of first voltages, where the voltage rail is configured to provide a second voltage value that is greater than the first voltage value; and converting the plurality of second voltages to an electrical signal, where the electrical signal is an analog representation of the digital codeword. In some implementations, the electrical signal may be a single-ended signal having a voltage swing greater than the first voltage value.

In some implementations, the step of driving the plurality of second voltages onto the respective bit lines may include steps of grounding one or more of the bit lines in response to receiving a corresponding one or more of the first voltages at the ground potential, and coupling one or more of the bit lines to the voltage rail in response to receiving a corresponding one or more of the first voltages at the first voltage value.

In some implementations, the step of driving the plurality of second voltages onto the respective bit lines may include steps of, for each of the first voltages, generating an LS voltage based on the first voltage, the LS voltage having one of the first voltage value or the second voltage value depending on the voltage value of the first voltage; driving a first switch using the LS voltage, where the first switch is configured to switchably couple a respective one of the bit lines to the voltage rail based on the voltage value of the LS voltage; and driving a second switch using the first voltage, where the second switch is configured to switchably couple the respective bit line to ground based on the voltage value of the first voltage.

In some aspects, the step of generating the LS voltage may include steps of driving the LS voltage to the first voltage value when the first voltage is at the ground potential, and driving the LS voltage to the second voltage value when the first voltage is at the first voltage value. In some aspects, the first switch is configured to couple the respective bit line to the voltage rail when the LS voltage is at the second voltage value, and decouple the respective bit line from the voltage rail when the LS voltage is at the first voltage value. In some aspects, the second switch is configured to couple the respective bit line to ground when the first voltage is at the ground potential, and decouple the respective bit line from ground when the first voltage is at the first voltage value.

An example electro-optical transmitter is also disclosed. The electro-optical transmitter includes a data driver and an electro-optic modulator (EOM). The data driver is configured to receive a plurality of first voltages corresponding to respective bits of a digital codeword and drive a plurality of second voltages onto respective bit lines by switchably coupling each of the bit lines to ground or a voltage rail based at least in part on the voltage values of the plurality of first voltages. Each of the first voltages may have one of a first voltage value or a ground potential based on a value of the corresponding bit. Further, the voltage rail may be configured to provide a second voltage value that is greater than the first voltage value. The data driver is further configured to convert the plurality of second voltages to an electrical signal. For example, the electrical signal may be an analog representation of the digital codeword. In some implementations, the electrical signal may be a single-ended signal having a voltage swing greater than the first voltage value. The EOM is configured to receive the electrical signal via an electrical medium and convert the electrical signal to an optical signal for transmission over an optical medium.

In some implementations, the data driver may comprise a plurality of slices configured to receive the plurality of first voltages, respectively. Each of the slices is coupled to a respective one of the bit lines and comprises a level shifter, a first switch, and a second switch. The level shifter is configured to generate an LS voltage based on the received first voltage. The LS voltage may have one of the first voltage value or the second voltage value depending on the voltage value of the first voltage. The first switch is configured to switchably couple the respective bit line to the voltage rail based on the voltage value of the LS voltage. The second switch is configured to switchably couple the respective bit line to ground based on the voltage value of the first voltage.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Aspects of the present disclosure are directed to improving data recovery in photonic ICs. A photonic IC may include an electrical transmitter and an electro-optic modulator (EOM). The electrical transmitter generates an electrical signal based on binary input data and the EOM converts the electrical signal to a corresponding optical signal. A large optical modulation amplitude (OMA) is desirable for accurate data recovery at the receiver. However, many factors along the communications path may reduce or limit the OMA of the optical signal. For example, high-speed data serializers tend to produce relatively low voltage swings. Thus, the voltage levels of the input data may be limited by the rate of serialization. The present embodiments may increase the voltage swing of the electrical signal by "boosting" the voltages of the input data and using the boosted voltages to drive the voltage of the electrical signal. As a result, the voltage swing of the electrical signal may be substantially higher (e.g., double) the maximum voltage of the input data. Since the voltage swing of the electrical signal is directly correlated with the OMA of the optical signal, the present embodiments may achieve a significantly higher OMA compared to conventional photonic ICs.

Figure 1:
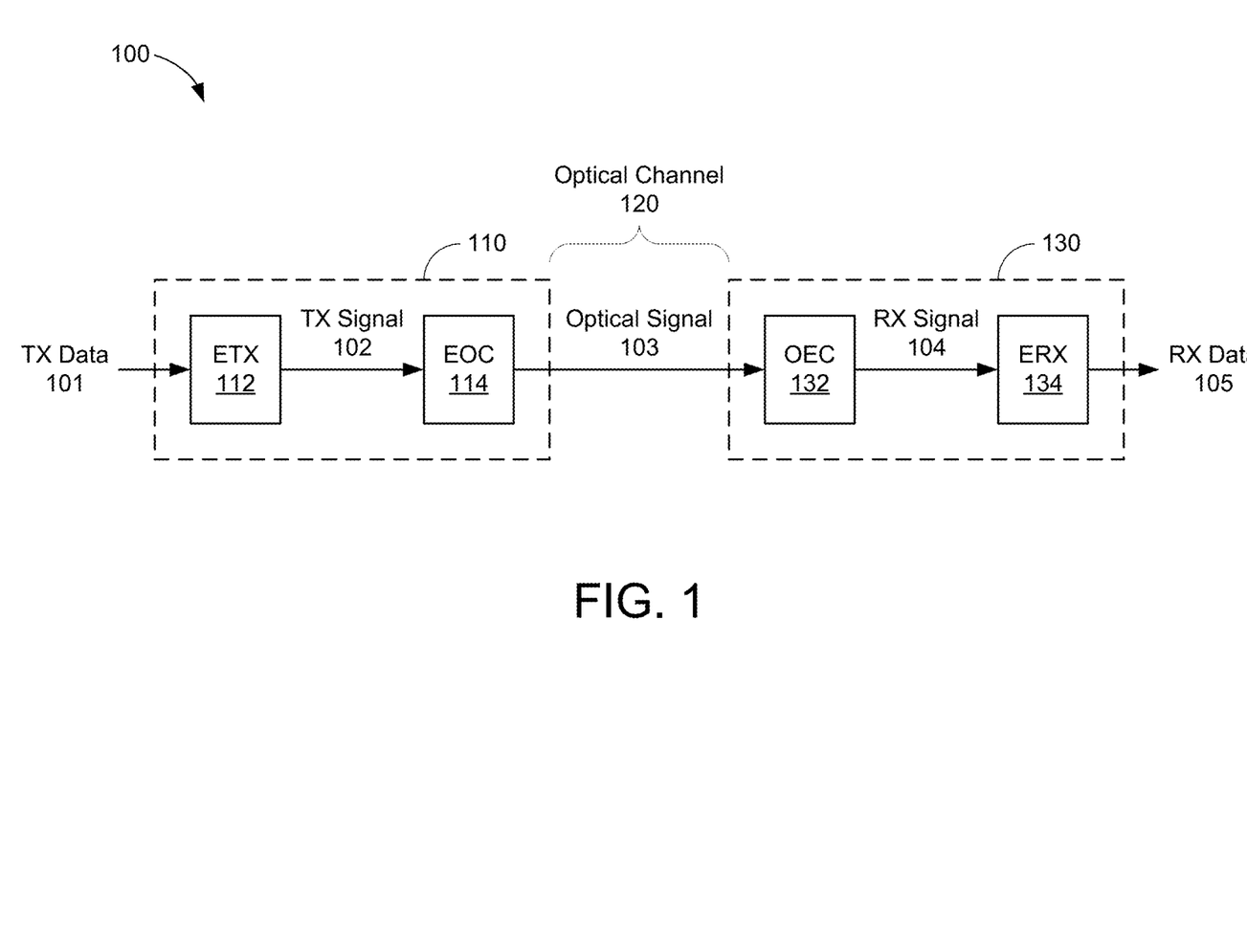
FIG. 1 is a block diagram of an example optical communication system.

FIG. 1 is a block diagram of an example optical communication system 100. The communication system 100 includes a transmitter 110 coupled to a receiver 130 via an optical communication channel 120. In some embodiments, the optical communication system 100 may be a serial communication system. For example, the transmitter 110 may be part of a serializer-deserializer (SerDes) and the receiver 130 may be part of a different SerDes. The communication channel 120 may form an optical path between the transmitter 110 and the receiver 130. For example, the communication channel 120 may include one or more optical fibers, silicon waveguides, or other optical media. In some implementations, the transmitter 110 and the receiver 130 may be disposed on a single photonic integrated circuit (IC). In some other implementations, the transmitter 110 and the receiver 130 may be disposed on separate integrated circuits.

The transmitter 110 includes an electrical transmitter (ETX) 112 and an electrical-to-optical converter (EOC) 114. The ETX 112 is coupled to the EOC 114 via an electrical medium (e.g., traces, vias, cables, connectors, decoupling capacitors, and the like). The ETX 112 may drive binary transmit (TX) data 101 onto the electrical medium, as an electrical TX signal 102, using a digital baseband modulation technique. In some implementations, the TX signal 102 may carry one or more data symbols that correspond to the TX data 101 (e.g., where each data symbol represents one or more bits of TX data 101). For example, the ETX 112 may convert each symbol into an analog voltage mapped to that particular symbol. In some aspects, the ETX 112 may use a 4-level pulse-amplitude modulation (PAM-4) scheme to map the data symbols to 4 discrete voltage levels (e.g., where each voltage level represents 2 bits of TX data 101). Accordingly, the voltage level(s) of the TX signal 102 may correspond to the data symbols representing the TX data 101.

The EOC 114 converts the TX signal 102 from the electrical domain to an optical domain. In some embodiments, the EOC 114 may comprise an electro-optic modulator (EOM) that converts the TX signal 102 to an optical signal 103 by encoding the TX data 101 onto an optical carrier. In some aspects, the EOC 114 may be a ring modulator (RM) or an electro-absorption modulator (EAM) configured to modulate the amplitude or phase of light (e.g., the optical carrier) emitted by a light source (not shown for simplicity). For example, the light source may be a continuous-wave (CW) laser, light-emitting diode (LED), or other light emitting device. The EOC 114 may include a waveguide to receive and modulate the optical carrier in response to the TX signal 102. For example, the EOC 114 may modulate the amplitude (e.g., intensity) of the optical carrier by applying an external electric field to the waveguide. The electric field may be generated, at least in part, by the TX signal 102. More specifically, the refractive index of the waveguide may vary proportionally with the electric field. As a result, the amplitude of the optical signal 103 may track the amplitude of the TX signal 102. Thus, in some aspects, the optical signal 103 may also use PAM-4 modulation.

The receiver 130 includes an optical-to-electrical converter (OEC) 132 and an electrical receiver (ERX) 134. The OEC 132 is coupled to the ERX 134 via an electrical medium (e.g., traces, vias, cables, connectors, decoupling capacitors, and the like). The OEC 132 receives the optical signal 103 via the optical channel 120 and converts the optical signal 103 from the optical domain back to the electrical domain. In some embodiments, the OEC 132 may include an optical modulator to receive and/or amplify the wavelength of light associated with the optical signal 103 and a photodetector to convert the optical power of the received signal 103 to an electrical current. Thus, the OEC 132 may convert the optical signal 103 to an electrical receive (RX) signal 104. The ERX 134 receives the RX signal 104 from the OEC 132 and converts the received data symbols back to binary RX data 105. In some implementations, the ERX 134 may include clock and data recovery (CDR) circuitry to recover the digital RX data 105 carried by the analog RX signal 104. For example, the ERX 134 may convert the electrical current to voltage and decode the RX data 105 from the corresponding voltages (e.g., using PAM-4 demodulation).

It is noted that the accuracy of the RX data 105 may depend on the accuracy and/or fidelity with which the TX data 101 is transmitted along the communications path (e.g., from the transmitter 110 to the receiver 130). In particular, aspects of the present disclosure recognize that a large optical modulation amplitude (OMA) may be desirable for accurate data recovery at the receiver 130. However, many factors along the communications path may adversely affect (e.g., reduce or limit) the OMA of the optical signal 103. For example, the TX signal 102 may degrade (e.g., due to path loss) as it propagates between the ETX 112 and the EOC 114, and the optical signal 103 may also degrade as it propagates between the EOC 114 and the OEC 132. Furthermore, nonlinearities in the EOC 114 may cause distortion in the optical signal 103 when converting between the electrical domain and the optical domain. Such attenuating factors may add to the difficulty and/or complexity of data recovery at the receiver 130.

Aspects of the present disclosure recognize that the amplitude of the optical signal 103 is directly correlated with the voltage swing of the TX signal 102. Thus, increasing the maximum voltage of the TX signal 102 may improve the OMA of the optical signal 103. However, it is also noted that the voltage levels of the TX data 101 may be limited by the rate of serialization. Specifically, high-speed data serializers may produce relatively low voltage swings. Thus, in some embodiments, the ETX 112 may be configured to drive the TX signal 102 to a maximum voltage that is greater than the maximum voltage of the TX data 101 while maintaining a high rate of data transfer (e.g., 56 Gbps). As described in greater detail below, driving the TX signal 102 at high speeds may require fast switching between a voltage rail (e.g., configured to provide the higher voltage value) and electrical ground. In some aspects, the ETX 112 may shift or increase the voltage levels of the TX data 101 to drive (e.g., open or close) the switches coupled to the higher voltage value.

Figure 2:
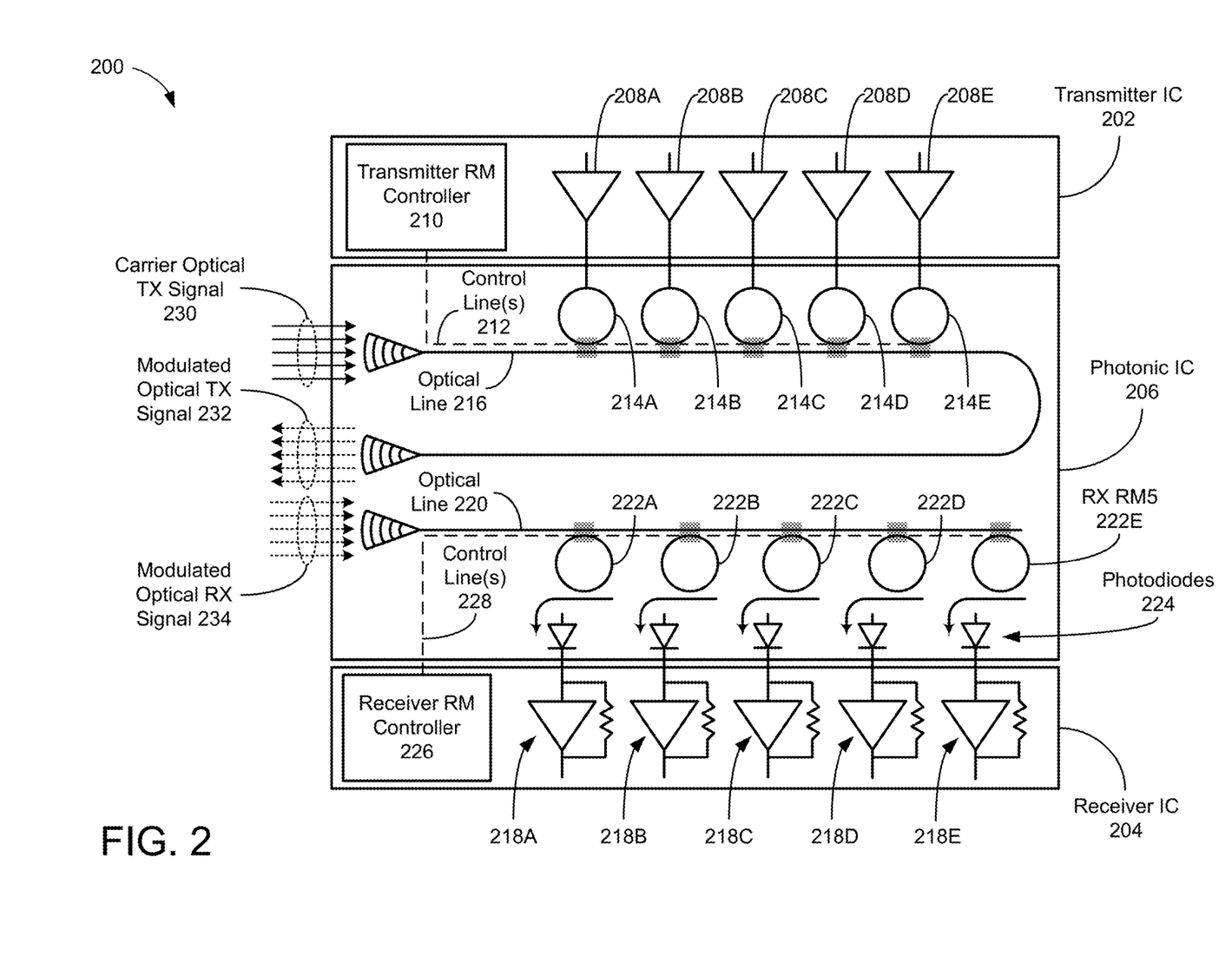
FIG. 2 is a block diagram of an example optical transceiver.

FIG. 2 is a block diagram of an example optical transceiver 200. The optical transceiver 200 may be an example embodiment of the transmitter 110 or the receiver 130 of FIG. 1. In some example implementations, the optical transceiver 200 may be a 5×112 Gbps WDM transceiver. However, other suitable configurations for an optical transceiver are also contemplated, and the present disclosure should not be limited to the illustrated example. The optical transceiver 200 includes a transmitter integrated circuit (IC) 202, a receiver IC 204, and a photonic IC 206.

The transmitter IC 202 includes transmit (TX) buffers 208A-208E for five separate transmit channels. The TX buffers 208A-208E may be an example embodiment of the ETX 112 of FIG. 1. Each of the TX buffers 208A-208E may be coupled to a corresponding TX ring modulator (RM) 214A-214E (included in the photonic IC) and is responsible for providing data to the respective RM for transmission via an optical signal. The TX RMs 214A-214E may be an example embodiment of the EOC 114 of FIG. 1. The TX RMs 214A-214E also may be coupled to an optical line 216, and the optical line 216 may provide a carrier optical TX signal 230 that may be used (e.g. modulated) to carry the data signals received from the TX buffers 208A-208E. For example, each of the TX RMs 214A-214E may be configured to modulate data from a corresponding one of the TX buffers 208A-208E onto a different frequency portion of the carrier optical TX signal 230 to generate the modulated optical TX signal 232. The transmitter IC 202 may include a transmitter RM controller 210 configured to control operation of the TX RMs 214A-214E via one or more control lines 212.

On the receive (RX) side of the optical transceiver 200, the photonic IC 206 also may include RX RMs 222A-222E coupled to an optical line 220 which receives a modulated optical RX signal 234. The photonic IC 206 may further include a respective photodiode 224 for each of the RX RMs 222A-222E. The RX RMs 222A-222E, along with their respective photodiodes 224, may be an example embodiment of the OEC 132 of FIG. 1. The receiver IC 204 includes RX buffers 218A-288E. Each photodiode 224 is configured to convert the optical signal 234l, demodulated by a corresponding one of the RX RMs 222A-222E, to a corresponding electrical RX data signal and provide the electrical RX data signal to a respective one of the RX buffers 218A-218E. Any suitable photodiode may be used, including (but not limited to) an avalanche photodiode (APD). The receiver IC 204 may further include a receiver RM controller 226 configured to control operation of the RX RMs 222A-222E via one or more control lines 228.

As described above, the quality of a signal degrades as it travels through a lossy medium. More specifically, for high-speed serial transmissions, the communication medium (such as the optical line 216 or the electrical connections between the TX buffers 208A-208E and the TX RMs 214A-214E) may introduce frequency-dependent attenuation in the form of inter-symbol interference (ISO. For example, the modulated optical TX signal 232 may experience path loss on the optical line 216 between the optical transceiver 200 and a receiving device (not shown for simplicity). The electrical signals output by the TX buffers 208A-208E may also experience path loss on the electrical medium between the TX buffers 208A-208E and the TX RMs 214A-214E. As a result, the OMA of the modulated optical TX signal 232 at the receiving device may be reduced or compromised compared to the voltage swings of the electrical signals output by the TX buffers 208A-208E.

Furthermore, the optical transceiver 200 may distort the TX data along its transmit path (e.g., from the TX buffers 208A-208E to the TX RMs 214A-214E). For example, each of the TX RMs 214A-214E may introduce nonlinearities into the optical TX signals 232 during the conversion from the electrical domain to the optical domain. As described above, a TX RM may modulate the carrier optical signal 230 by changing the refractive index of a (ring) waveguide in response to an applied electric field. The change in refractive index causes a corresponding change in the polarity of light within the waveguide, which alters the amplitude or intensity of light emitted at the output of the waveguide (e.g., transmitted through a polarizer). For example, the polarizer may transmit only the component of light that has been rotated. Thus, the intensity of the light transmitted by the waveguide may not vary linearly with respect to the applied electric field (but rather, follows a sinusoidal relationship). In other words, due to nonlinearities in the TX RMs 214A-214E, the amplitude of the modulated optical TX signals 232 may vary nonlinearly with respect to the electrical TX signals (e.g., provided by the TX buffers 208A-208E).

Figure 3:
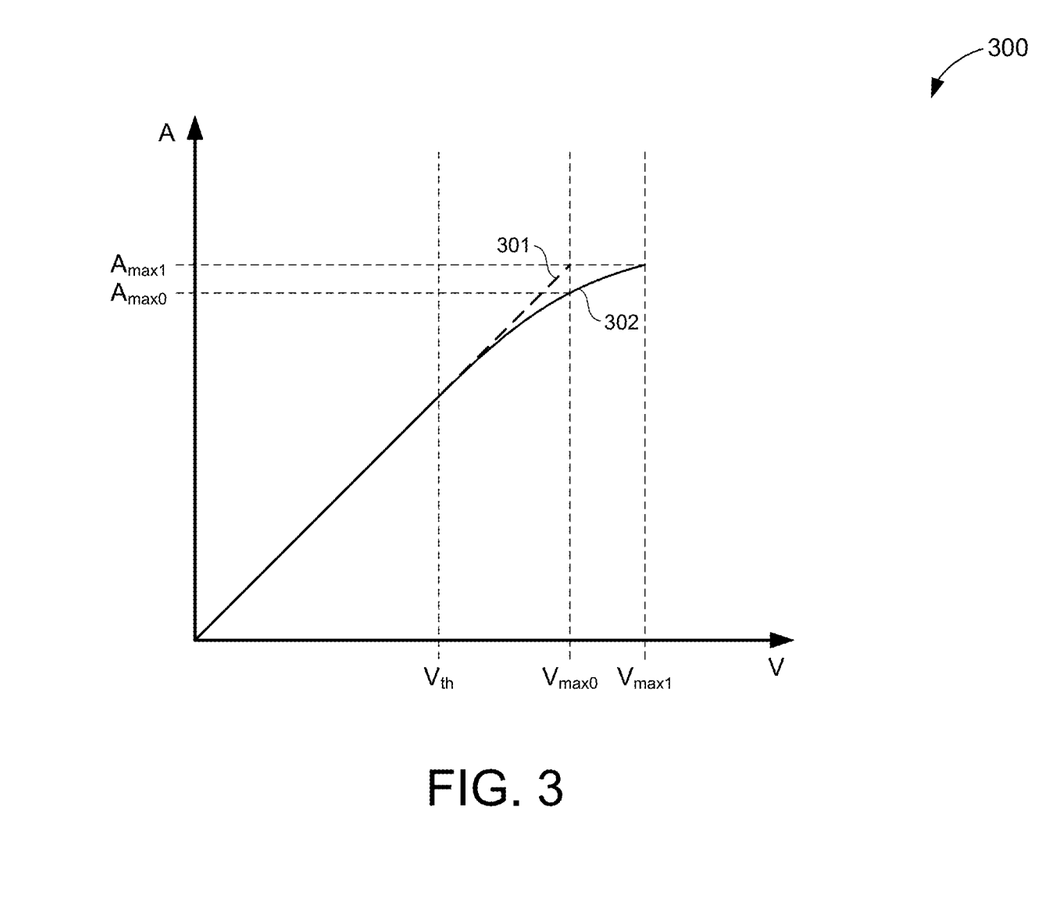
FIG. 3 is a graph comparing the amplitude of an optical signal relative to the voltage of an electrical signal in an example communication system.

FIG. 3 is a graph 300 comparing the amplitude of an optical signal relative to the voltage of an electrical signal in an example communication system. With reference for example to FIG. 2, the horizontal axis of the graph 300 represents the voltage (V) of the electrical signal (e.g., TX signal 102 of FIG. 1) input to a TX RM, and the vertical axis of the graph 300 represents the amplitude (A) of the optical signal (e.g., optical signal 103 of FIG. 1) output by the TX RM. A first curve 301 depicts an ideal (linear) relationship between the peak transmit voltage of the electrical signal and the peak amplitude of the resulting optical signal. A second curve 302 depicts the actual relationship between the peak transmit voltage of the electrical signal and the peak amplitude of the optical signal. It is noted, with respect to the second curve 302, that the amplitude of the optical signal varies substantially linearly in proportion to the voltage of the electrical signal up to a threshold voltage level ($V_{th}$). For electrical voltages that exceed the threshold voltage $V_{th}$, the amplitude of the resulting optical signal begins to taper. In other words, the amplitude of the optical signal varies nonlinearly in proportion to the voltage of the electrical signal beyond the threshold voltage level $V_{th}$.

As shown in FIG. 3, a significant increase in the voltage of the electrical signal (e.g., for $V>V_{th}$) may result in a relatively small increase in the amplitude of the optical signal. For example, when the electrical signal is at a maximum voltage level ($V_{max0}$), the amplitude of the corresponding optical signal ($A_{max0}$) is substantially lower than the desired amplitude ($A_{max1}$) for the given voltage level. This nonlinear relationship between the electrical signal and the optical signal may affect the accuracy of data symbol detection by a receiver (e.g., receiver 130 of FIG. 1). In order to maintain an OMA that accurately reflects the original TX data, it may be desirable to increase (e.g., "boost") the voltage of the electrical signal beyond its current maximum voltage level $V_{max0}$ (e.g., the voltage level associated with the original TX data) to an even greater voltage level ($V_{max1}$). Thus, in some embodiments, an electro-optical transmitter (e.g., transmitter 110 of FIG. 1) may include a boosted data driver capable of receiving input TX data having a maximum voltage value (e.g., $V_{max0}$) and driving a corresponding electrical signal to a voltage value (e.g., $V_{max1}$) greater than the maximum voltage value associated with the input TX data.

Figure 4:
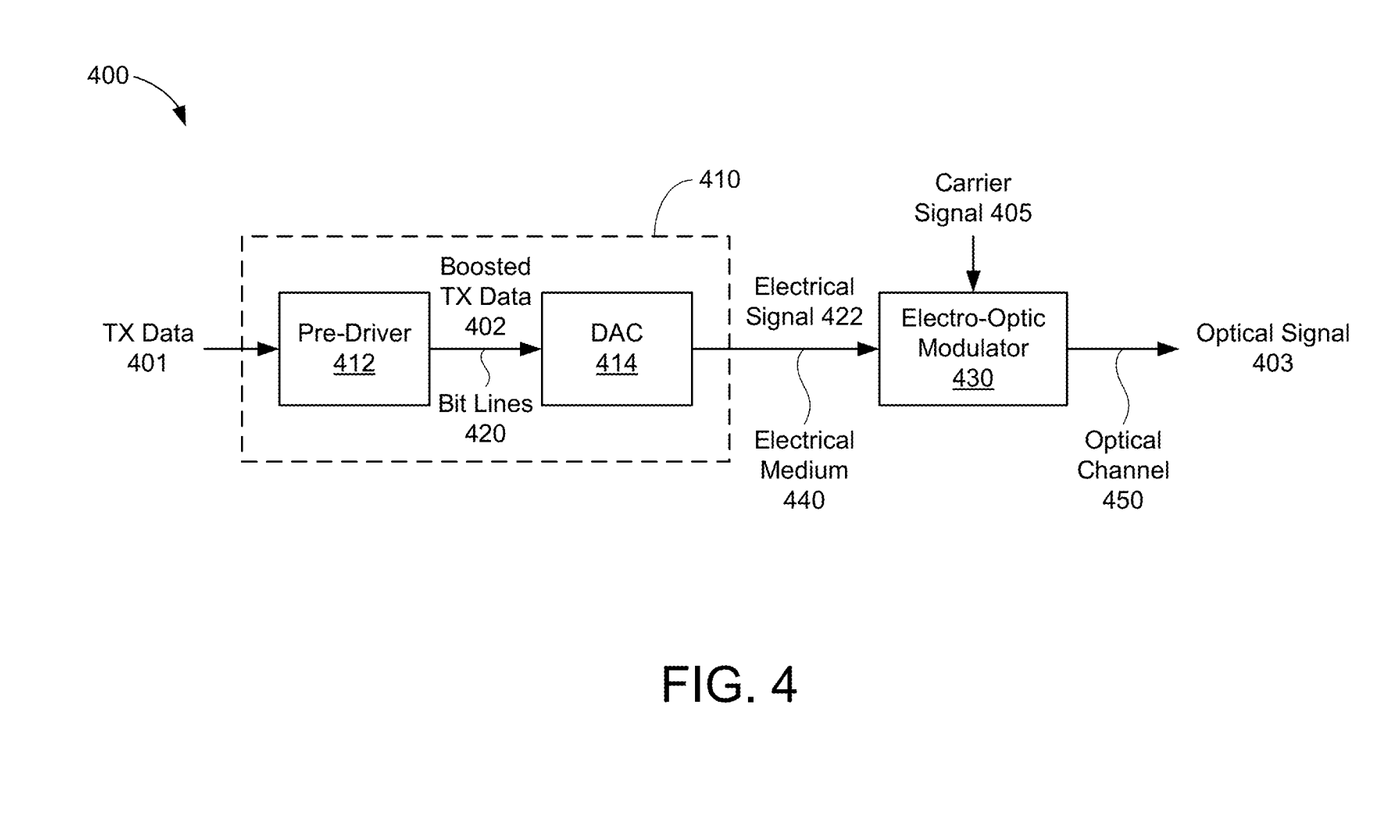
FIG. 4 is a block diagram of an electro-optical transmitter, in accordance with some embodiments.

FIG. 4 is a block diagram of an electro-optical transmitter 400, in accordance with some embodiments. The electro-optical transmitter 400 may be an example embodiment of the transmitter 110 of FIG. 1. Thus, the electro-optical transmitter 400 may be configured to transmit TX data 401 over an optical channel 450. The electro-optical transmitter 400 includes a data driver 410 and an electro-optic modulator 430.

The data driver 410 converts the TX data 401 to an electrical signal 422. The electrical signal 422 may be driven onto an electrical medium 440 coupling the data driver 410 to the electro-optic modulator 430. The data driver 410 may be an example embodiment of the ETX 112 of FIG. 1 or any of the TX buffers 208A-208E of FIG. 2. Thus, the data driver 410 may modulate the TX data 401 onto the electrical signal 422 using a digital baseband modulation technique. In some aspects, the data driver 410 may use pulse-amplitude modulation techniques (e.g., PAM-4) to encode the TX data 401 onto the electrical signal 422 (e.g., as one or more data symbols). In some embodiments, the data driver 410 may drive the electrical signal 422 to an even higher voltage value than the maximum voltage value associated with the TX data 401. For example, in some aspects, the voltage swing of the electrical signal 422 may be double the maximum voltage value of the TX data 401.

The data driver 410 includes a pre-driver 412 and a digital-to-analog converter (DAC) 414. The pre-driver 412 receives the TX data 401 and drives boosted TX data 402 onto a set of bit lines 420 based on the values of the TX data 401. In some embodiments, the boosted TX data 402 may include level-shifted (LS) copies of the TX data 401. For example, the TX data 401 may comprise a plurality of input voltages representing individual bit values of a digital codeword. Each of the input voltages may have either a low voltage value (e.g., ground or 0V) or a high voltage value (e.g., $V_{max0}$) depending on the value of the corresponding bit. More specifically, the low voltage value may represent a logic "0" whereas the high voltage value may represent a logic "1." The boosted TX data 402 may include a plurality of LS voltages representing the same bit values of the corresponding codeword. However, each LS voltage may have a higher voltage value than the corresponding input voltage. For example, each of the LS voltages may have either a low voltage value (e.g., $V_{max0}$) equal to the maximum voltage value associated with the input voltages or a high voltage value (e.g., $V_{max1}$) that is greater than the maximum voltage value of the input voltages.

The DAC 414 receives the boosted TX data 402 via the bit lines 420 and converts the digital codeword (encoded by the boosted TX data 402) to a corresponding electrical signal 422. More specifically, the electrical signal 422 may be an analog representation of the digital codeword. In some embodiments, the DAC 414 may drive the voltage of the electrical signal 422 above the maximum voltage value associated with the TX data 401 while maintaining a high rate of conversion. For example, each of the bit lines 420 may be switchably coupled between electrical ground and a voltage rail. The voltage rail may be configured to provide a voltage value (e.g., $V_{max1}$) greater than the maximum voltage associated with the TX data 401 (e.g., $V_{max0}$). To provide fast switching between the voltage rail and ground, the DAC 414 may use the input voltages to drive one or more switches configured to couple the bit lines 420 to ground while using the LS voltages to drive one or more switches configured to couple the bit lines 420 to the voltage rail.

The electro-optic modulator 430 converts the electrical signal 422 to the optical signal 403. The optical signal 403 may be transmitted, via the optical channel 450, to a receiving device (such as the receiver 130 of FIG. 1). The electro-optic modulator 430 may be an example embodiment of the EOC 114 of FIG. 1 or any of the TX RMs 214A-214E of FIG. 2. Thus, the electro-optic modulator 430 may be an RM or EAM configured to modulate the amplitude or phase of an optical carrier 405. The optical carrier 405 may be emitted by an external light source (not shown for simplicity). In some aspects, the electro-optic modulator 430 may modulate the amplitude (e.g., intensity) of the optical signal 403 by applying an external electric field to a waveguide coupled to receive one or more wavelengths of the optical carrier 405. The electric field may be generated, at least in part, by the electrical signal 422. The refractive index of the waveguide may vary proportionally with the electric field. As a result, the amplitude of the optical signal 403 may vary directly with the amplitude (e.g., voltage level) of the electrical signal 422. Thus, in some aspects, the optical signal 403 may also use PAM (e.g., PAM-4) modulation.

Among other advantages, aspects of the present disclosure may improve the OMA of the optical signal 403. For example, by converting the TX data 401 to boosted TX data 402, the data driver 410 may drive the electrical signal 422 higher than the maximum voltage associated with the TX data 401. As a result, the voltage swing of the electrical signal 422 may be increased, which translates to a greater OMA for the optical signal 403. As described above, a greater OMA generally provides for more accurate data recovery at the receiving device.

The ability to increase the voltage swing of the electrical signal 422 may also allow further fine-tuning of the optical signal 403, for example, to compensate for distortion and/or signal degradation. For example, the electro-optic modulator 430 may introduce nonlinearities into the optical signal 403 when converting the electrical signal 422 from the electrical domain to the optical domain. Furthermore, the electrical signal 422 and the optical signal 403 may experience path loss due to ISI in the electrical medium 440 and the optical channel 450, respectively. In some embodiments, the electro-optical transmitter 400 may compensate for such loss and/or non-linearities by pre-emphasizing and/or pre-distorting the electrical signal 422. In order to perform the pre-emphasis and/or pre-distortion, the electro-optical transmitter 400 may dynamically increase the voltages associated with certain values of the TX data 401 beyond their original voltage values. Thus, the data driver 410 of the present embodiments may enable such pre-emphasis and/or pre-distortion to be performed on the electrical signal 422.

Figure 5:
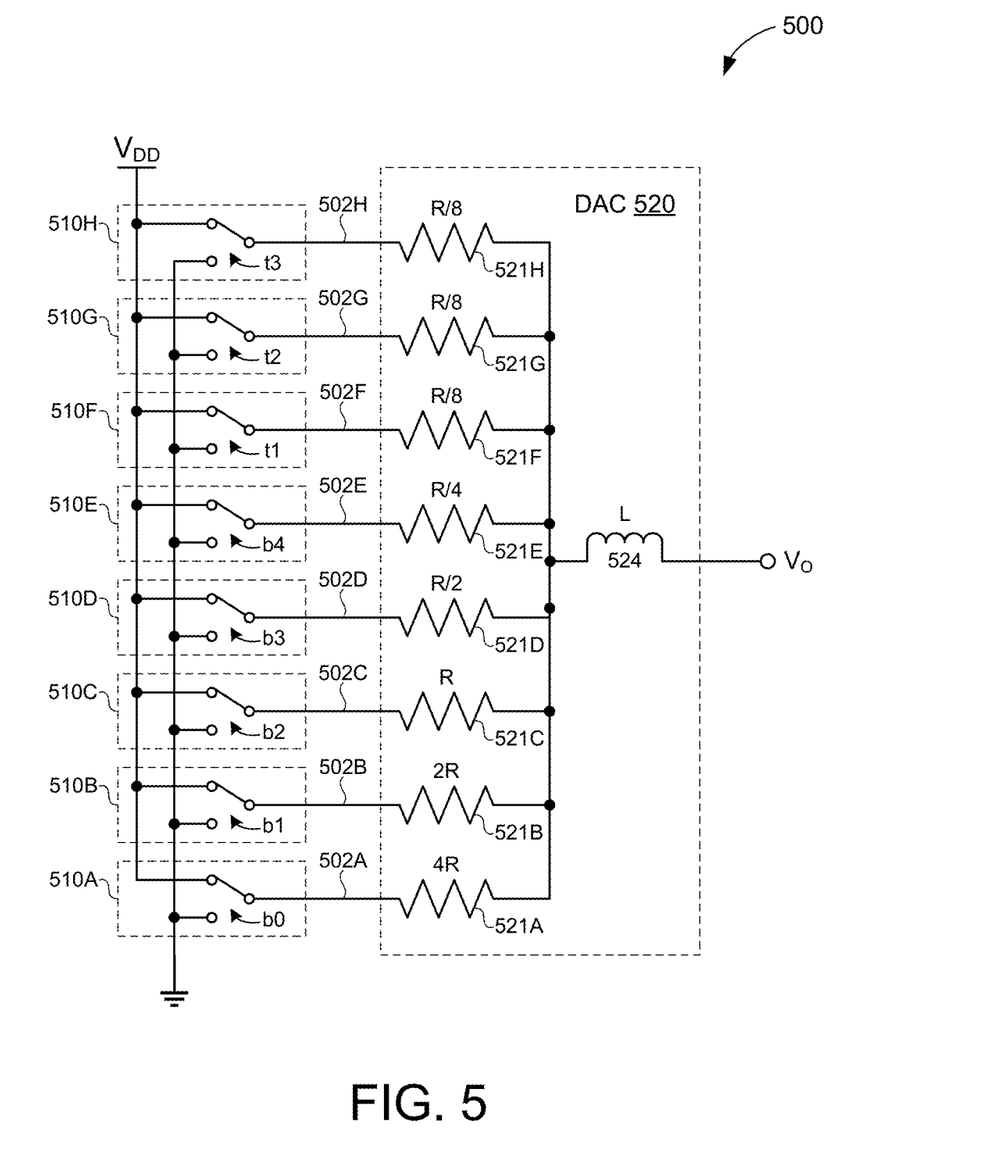
FIG. 5 is a circuit diagram of a digital-to-analog converter (DAC)-based data driver, in accordance with some embodiments.

FIG. 5 is a circuit diagram of a DAC-based data driver 500, in accordance with some embodiments. The data driver 500 may be an example embodiment of the data driver 410 of FIG. 4 and/or ETX 112 of FIG. 1. Thus, the data driver 500 may be configured to convert input data to an electrical signal ($V_O$). The input data may comprise one or more bits (b0-b4 and t1-t3) of a digital codeword. The data driver 500 includes a number of pre-driver slices 510A-510H coupled to a DAC 520 via respective bit lines 502A-502H.

The pre-driver slices 510A-510H, collectively, may be an example embodiment of the pre-driver 412 of FIG. 4. The pre-driver slices 510A-510H may switchably couple the bit lines 502A-502H to a voltage rail (VOo) or ground based on the bits b0-b4 and t1-t3, respectively, of input data. In the example of FIG. 5, the data driver 500 is shown to convert an 8-bit digital codeword to an analog voltage $V_O$, where the 3 most significant bits (MSBs) are thermometer-coded (e.g., as bits t1-t3) and the 5 least significant bits (LSBs) are binary-coded (e.g., as bits b0-b4). In other words, bits t1-t3 may represent 2 binary bits of input data. However, in actual implementations, the data driver 500 may be configured to receive digital inputs comprising any number of bits (including any number of thermometer-coded and/or binary-coded bits). In some embodiments, the voltage rail $V_{DD}$ may be at a substantially higher potential than the maximum voltage of any of the bits b0-b4 or t1-t3 (e.g., for a logic "1" value). Thus, in some aspects, each of the pre-driver slices 510A-510H may including level-shifting circuitry and switching circuitry to drive a voltage onto its bit line that is significantly higher than the voltage of the received bit.

Each of the pre-driver slices 510A-510H may operate in the same, or substantially similar, manner. With reference for example to the first driver slice 510A, the slice 510A may couple the bit line 502A to ground when the first bit b0 has a low voltage value (e.g., 0V) and may couple the bit line 502A to the voltage rail $V_{DD}$ when the first bit b0 has a high voltage value (e.g., $V_{max}$). In some aspects, $V_{max}$ may be significantly lower than the potential of the voltage rail $V_{DD}$. For example, the voltage rail $V_{DD}$ may be double the maximum voltage of any of the bit values b0-b4 or t1-t3 (e.g., $V_{DD}=2V_{max}$). Thus, in some embodiments, the slice 510A may use level-shifting techniques to drive a switch coupling the voltage rail $V_{DD}$ to the bit line 502A when the first bit b0 has a high voltage value. As a result, the voltage swing on the bit lines 502A-502H may be greater than (e.g., double) the voltage swing of any of the bit values b0-b4 or t1-t3.

The DAC 520 may be an example embodiment of the DAC 414 of FIG. 4. The DAC 520 includes a number of resistors 521A-521H. The resistors 521A-521H are coupled to the bit lines 502A-502H. The resistance values of each of the resistors 521A-521H (e.g., 4R, 2R, R, R/2, R/4, R/8, R/8, and R/8, respectively) are proportioned such that each of the bit lines 502A-502H contributes a proportional share of the total current at the output of the DAC 520 ($V_O$) based on its associated bit position in the digital codeword. Accordingly, the voltage at the output of the DAC 520 ($V_O$) can be expressed as:

$$V_O = \frac{V_A}{4} + \frac{V_B}{2} + V_C + 2V_D + 4V_E + 8(V_F + V_G + V_H)$$

where $V_A$-$V_H$ represent the voltages on the bit lines $502_A$-$502_H$, respectively (e.g., as driven by the slices 510A-510H). Since the voltages $V_A$-$V_E$ represent the LSBs of an 8-bit digital codeword and the voltages $V_F$-$V_H$ represent the MSBs of the digital thermometer codeword, the voltage of the electrical signal $V_O$ can be further expressed as:

$$V_O = \frac{\text{Digital\_Codeword}}{127} * V_{DD}$$

As described above, the voltage rail $V_{DD}$ may be greater than (e.g., double) the maximum voltage potential of the input bits b0-b4 and t1-t3. Accordingly, the electrical signal $V_O$ output by the data driver 500 may also have a voltage swing greater than the voltage swing of the input data. In the example of FIG. 5, the voltage of the electrical signal $V_O$ may vary from 0V to $V_{DD}$. Thus, the electrical signal $V_O$ may be a single-ended signal. In some embodiments, an inductor 524 may be coupled (in series) to the output of the DAC 520 to boost the bandwidth of the electrical signal $V_O$ for high data-rate communications.

Figure 6A:
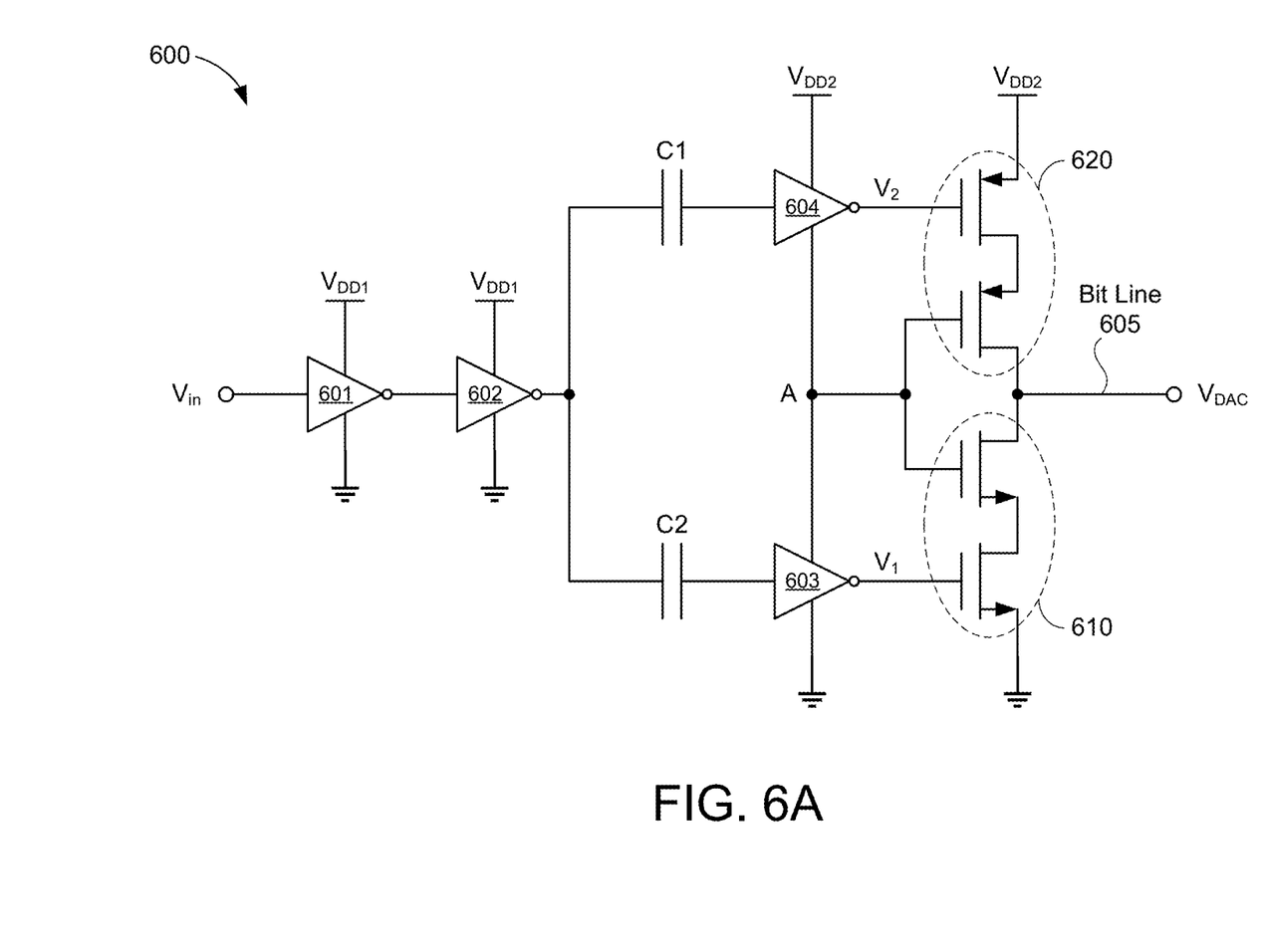
FIG. 6A is a circuit diagram of a level-shifting pre-driver, in accordance with some embodiments.

FIG. 6A is a circuit diagram of a level-shifting pre-driver 600 for a DAC, in accordance with some embodiments. The pre-driver 600 may be an example embodiment of any of the pre-driver slices 510A-510H of FIG. 5. Thus, the pre-driver 600 may be configured to switchably couple a bit line 605 to a voltage rail or ground based on the value of an input voltage $V_{in}$. The pre-driver 600 includes a number of inverters 601-604, a pair of capacitors C1 and C2, and a pair of switches 610 and 620.

In some embodiments, the pre-driver 600 may include at least two different voltage rails $V_{DD1}$ and $V_{DD2}$. In the example of FIG. 6A, the potential of the second voltage rail $V_{DD2}$ may be double the potential of the first voltage rail $V_{DD1}$ (e.g., $V_{DD2}=2*V_{DD1}$). Furthermore, the maximum potential of the input voltage $V_{in}$ may be substantially equal to the potential of the first voltage rail $V_{DD1}$, and thus half the potential of the second voltage rail $V_{DD2}$. For example, the input voltage $V_{in}$ may have a voltage value of either 0V (e.g., for a logic "0" bit) or $V_{DD1}$ (e.g., for a logic "1" bit). The inverters 601 and 602 are coupled between the first voltage rail $V_{DD1}$ and ground. Thus, the inverters 601 and 602 are configured to drive the input voltage $V_{in}$ to the capacitors C1 and C2. Although only two inverter stages 601 and 602 are shown coupled to the first voltage rail $V_{DD1}$ in the example of FIG. 6A, the pre-driver 600 may include any number of inverter stages to drive the input voltage $V_{in}$ to the capacitors C1 and C2 depending on the configuration and/or requirements of the pre-driver 600.

The capacitors C1 and C2, combined with the inverters 603 and 604, operate as a level-shifter for the input voltage $V_{in}$. For example, the inverter 604 is coupled between the second voltage rail $V_{DD2}$ and node A while the inverter 603 is coupled between node A and ground. In the example of FIG. 6A, the inverters 603 and 604 may be identical. Accordingly, node A may be biased at half the potential of the second voltage rail $V_{DD2}$ (e.g., $V_A=V_{DD2}/2$). In some aspects, the potential at node A may be held at a regulated voltage (e.g., using the first voltage rail $V_{DD1}$). The inverter 603 may output a first voltage V1 corresponding to a direct inverse of the input voltage $V_{in}$. With reference for example to the timing diagram 650 of FIG. 6B, the first voltage V1 may be low (e.g., 0V) when the input voltage $V_{in}$ is high (e.g., $V_{DD1}$), and the first voltage V1 may be high (e.g., $V_{DD2}/2$) when the input voltage $V_{in}$ is low (e.g., 0V). The inverter 604 may output a second voltage V2 corresponding to a level-shifted inverse of the input voltage $V_{in}$. With reference for example to the timing diagram 650 of FIG. 6B, the second voltage V2 may be low (e.g., $V_{DD2}/2$) when the input voltage $V_{in}$ is high (e.g., $V_{DD1}$), and the second voltage V2 may be high (e.g., $V_{DD2}$) when the input voltage $V_{in}$ is low (e.g., 0V).

The switches 610 and 620 are configured to drive an output voltage $V_{DAC}$ onto the bit line 605 by switchably coupling the bit line 605 to either ground or the second voltage rail $V_{DD2}$. More specifically, the first switch 610 is configured to switchably couple the bit line 605 to ground based on the first voltage V1 and the second switch 620 is configured to switchably couple the bit line 605 to the second voltage rail $V_{DD2}$ based on the second voltage V2. In the example of FIG. 6A, the first switch 610 comprises a pair of n-channel metal-oxide-semiconductor (NMOS) transistors coupled in series, where one of the NMOS transistors has a source coupled to ground and a gate coupled to the output of the inverter 603 and the other NMOS transistor has a drain coupled to the bit line 605 and a gate coupled to node A (e.g., $V_{DD2}/2$). The second switch 620 comprises a pair of p-channel metal-oxide-semiconductor (PMOS) transistors coupled in series, where one of the PMOS transistors has a source coupled to the second voltage rail $V_{DD2}$ and a gate coupled to the output of the inverter 604 and the other PMOS transistor has a drain coupled to the bit line 605 and a gate coupled to node A (e.g., $V_{DD2}/2$).

Figure 6B:
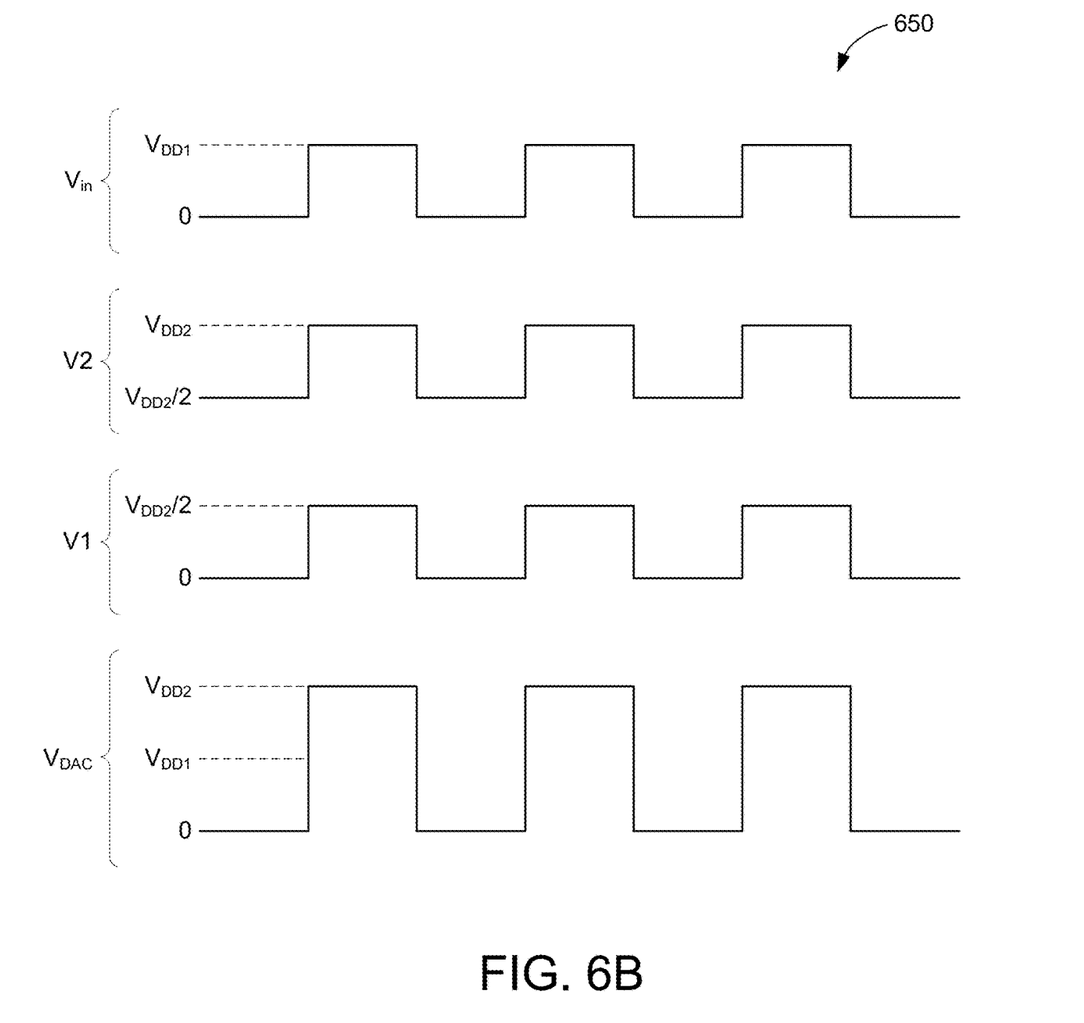
FIG. 6B is a timing diagram depicting an example relationship between the input voltage and output voltage of the level-shifting pre-driver of FIG. 6A.

When the input voltage $V_{in}$ is low (e.g., 0V), the first voltage V1 is high (e.g., $V_{DD2}/2$) and the second voltage V2 is high (e.g., $V_{DD2}$). The high first voltage V1 causes the first switch 610 to couple the bit line 605 to ground while the high second voltage V2 causes the second switch 620 to decouple the bit line from the second voltage rail $V_{DD2}$. Thus, the output voltage $V_{DAC}$ is equal to the input voltage $V_{in}$ for logic "0" bit values (e.g., as shown in FIG. 6B). When the input voltage $V_{in}$ is high (e.g., $V_{DD2}/2$), the first voltage V1 is low (e.g., 0V) and the second voltage V2 is low (e.g., $V_{DD2}/2$). The low first voltage V1 causes the first switch 610 to decouple the bit line 605 from ground while the low second voltage V2 causes the second switch 620 to couple the bit line 605 to the second voltage rail $V_{DD2}$. Thus, the output voltage $V_{DAC}$ is double the input voltage $V_{in}$ for logic "1" bit values (e.g., as shown in FIG. 6B). The output voltage $V_{DAC}$ may be an example embodiment of the boosted TX data 402 of FIG. 4. In the example of FIG. 6A, the voltage swing of the output voltage $V_{DAC}$ is double the voltage swing of the input voltage $V_{in}$.

Figure 7:
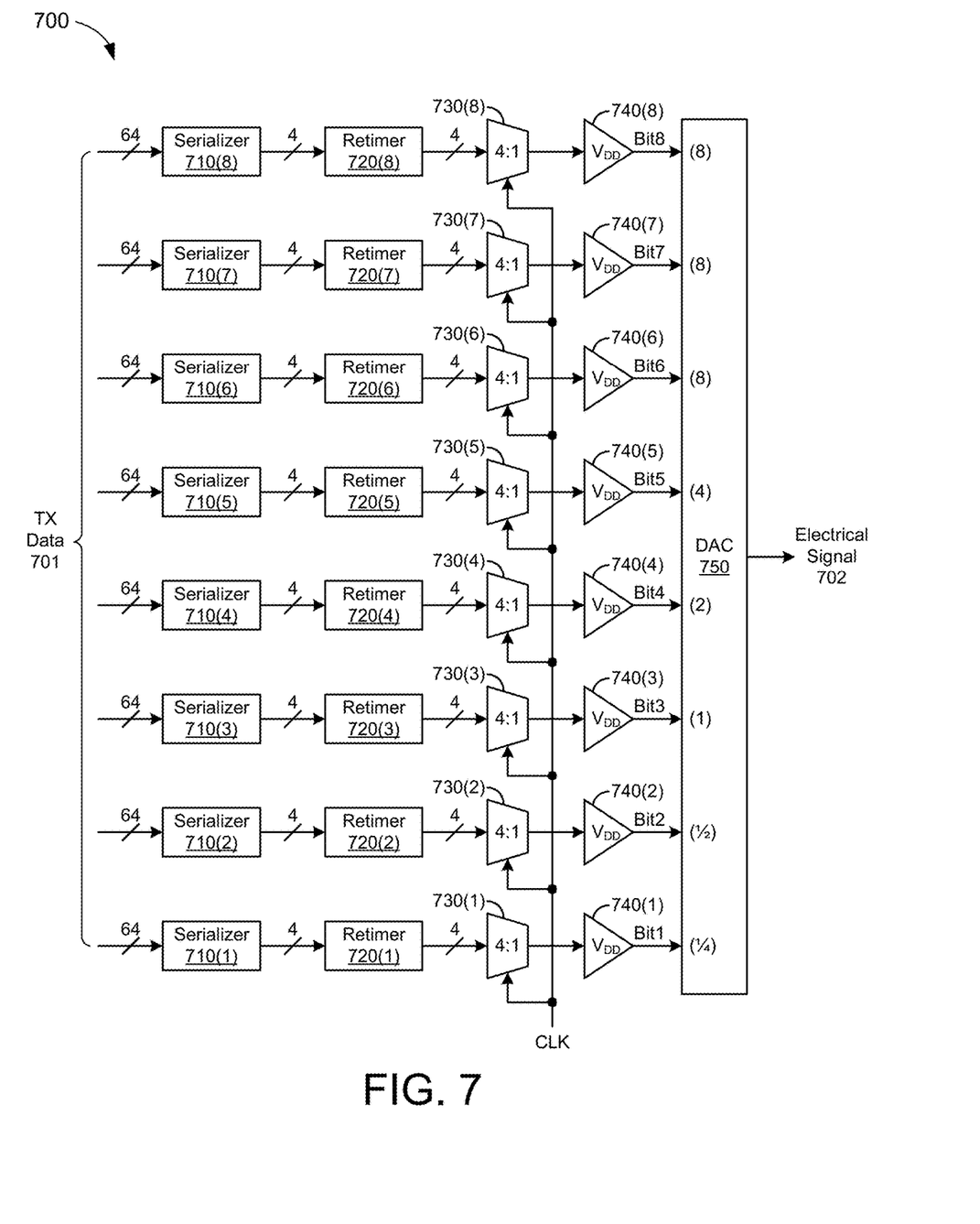
FIG. 7 is a block diagram of a DAC-based electrical transmitter, in accordance with some embodiments.

FIG. 7 is a block diagram of a DAC-based electrical transmitter 700, in accordance with some embodiments. The electrical transmitter 700 may be part of a SerDes communication system. Thus, the electrical transmitter 700 may be configured to serialize TX data 701 and convert the serialized data to an electrical signal 702. In some embodiments, the electrical signal 702 may be used to drive an optical modulator (such as the electro-optic modulator 430 of FIG. 4 or any of the TX RMs 214A-214E of FIG. 2). The electrical transmitter 700 includes a number of serializers 710(1)-710(8), retimers 720(1)-720(8), multiplexers 730(1)-730(8), pre-driver slices 740(1)-740(8), and a DAC 750.

In the example of FIG. 7, the electrical transmitter 700 is configured to generate a series of 8-bit digital codewords, where the 3 MSBs (e.g., bits 6-8) are thermometer-coded and the remaining 5 LSBs (e.g., bits 1-5) are binary-coded. In other words, bits 6-8 of each digital codeword may represent 2 binary bits of input data. However, in actual implementations, the electrical transmitter 700 may generate a series of n-bit digital codewords, where n may be any integer number.

Each of the serializers 710(1)-710(8) is configured to serialize a subset of the TX data 701. In the example of FIG. 7, each of the serializers 710(1)-710(8) is configured to convert 64 parallel bits of TX data 701 into 4 serial bitstreams. In some aspects, the serializers 710(1)-710(8) may operate at high data rates. For example, the 64 bits of TX data 701 may be received at a rate of 875 Mbps while the 4 serial bitstreams may be output at a rate of 14 Gbps. Thus, the voltages of the serial bitstreams may be relatively low. The retimers 720(1)-720(8) are configured to adjust the setup and hold timing between the serializers 710(1)-710(8) and the multiplexers 730(1)-730(8), respectively.

Each of the multiplexers 730(1)-730(8) is configured to further combine the 4 serial bitstreams (e.g., output by a respective serializer) to a single bitstream. In some aspects, each of the multiplexers 730(1)-730(8) may be controlled by a high-speed clock (CLK) signal. For example, the CLK signal may operate at 14 GHz to coincide with the 14 Gbps data rate of the 4 serial bitstreams. As a result, the output of each of the multiplexers 730(1)-730(8) may be a single bitstream having a data rate of 56 Gbps.

For each bit of serialized data output by the multiplexers 730(1)-730(8), the pre-driver slices 740(1)-740(8) are configured to drive voltages associated with the corresponding bits (Bit1-Bit8) onto a respective bit line coupled to the DAC 750. The pre-driver slices 740(1)-740(8) may be an example embodiment of the pre-driver slices 510(A)-510(H), respectively, of FIG. 5. Thus, the pre-driver slices 740(1)-740(8) may switchably couple the bit lines to a voltage rail $V_{DD}$ or ground based on the outputs of the multiplexers 730(1)-730 (8), respectively (e.g., as described above with respect to FIGS. 5 and 6). In some embodiments, the voltage rail may at a substantially higher potential than the maximum voltage output by any of the multiplexers 730(1)-730(8). As a result, the voltage swings at the outputs of the pre-driver slices 740(1)-740(8) may be greater than the voltage swings at the inputs to the pre-driver slices 740(1)-740(8).

The DAC 750 receives the voltages output by the pre-driver slices 740(1)-740(8) and converts the digital codeword (Bit1-Bit8) to a corresponding electrical signal 702. More specifically, the electrical signal 702 may be an analog representation of the digital codeword. The DAC 750 may be an example embodiment of the DAC 520 of FIG. 5. Thus, the DAC 750 may include a number of resistors to convert the voltages Bit1-Bit8 to a corresponding current (e.g., as described above with respect to FIG. 5). The combined current across each of the resistors may be used to generate the electrical signal 702. In some aspects, the resistances of each of the resistors may be configured such that each of the voltages Bit1-Bit8 contributes a proportional share (e.g., ¼, ½, 1, 2, 4, 8, 8, and 8, respectively) to the electrical signal 702 based on its associated bit position within the digital codeword.

Figure 8:
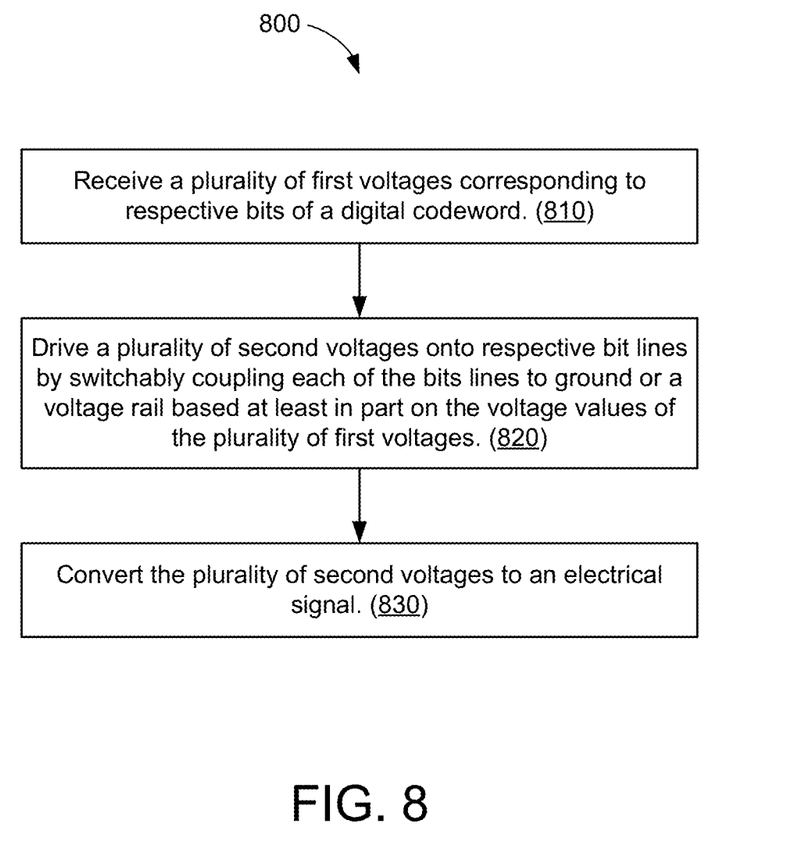
FIG. 8 is an illustrative flow chart depicting an example digital-to-analog conversion operation, in accordance with some embodiments.

FIG. 8 is an illustrative flow chart depicting an example digital-to-analog conversion operation 800, in accordance with some embodiments. With reference for example to FIG. 5, the example operation 800 may be performed by the data driver 500 to convert digital input data to an analog electrical signal.

The data driver may receive a plurality of first voltages corresponding to respective bits of a digital codeword (810). For example, the digital input data may comprise a plurality of input voltages representing individual bit values of a digital codeword. Each of the input voltages may have either a low voltage value (e.g., ground or 0V) or a high voltage value (e.g., $V_{max0}$) depending on the value of the corresponding bit. More specifically, the low voltage value may represent a logic "0" whereas the high voltage value may represent a logic "1." In some embodiments, the MSBs of the digital codeword may be thermometer-coded and the remaining LSBs may be binary-coded. With reference for example to FIG. 5, the 3 MSBs (e.g., bits t1-t3) of the received 8-bit codeword may represent 2 MSBs of a corresponding 7-bit binary codeword.

The data driver may drive a plurality of second voltages onto respective bit lines by switchably coupling each of the bit lines to ground or a voltage rail based at least in part on the voltage potentials of the plurality of first voltages (820). For example, the data driver may include a number of pre-driver slices (such as the pre-driver slices 510A-510H of FIG. 5) coupled to the respective bit lines. The pre-driver slices may switchably couple the bit lines to the voltage rail ($V_{DD}$) or ground based on the received bits of input data. In some embodiments, the voltage rail $V_{DD}$ may be at a substantially higher potential than the maximum voltage of any of the received bits (e.g., for a logic "1" value). Thus, in some aspects, each of the pre-driver slices may including level-shifting circuitry, in combination with switching circuitry, to drive a voltage onto its bit line that is significantly higher than the voltage of the received bit (e.g., as described above with respect to FIG. 6A).

The data driver may further convert the plurality of second voltages to an electrical signal (830). For example, the data driver may include a DAC (such as the DAC 520 of FIG. 5). The DAC may include a number of resistors to convert the voltages on each of the bit lines to a corresponding current (e.g., as described above with respect to FIG. 5).

The combined current across each of the resistors may be used to generate the electrical signal. In some aspects, the resistances of each of the resistors may be configured such that the voltages on each of the bit lines contributes a proportional share to the electrical signal based on its associated bit position within the digital codeword. Thus, the electrical signal may be an analog representation of the digital codeword. It is noted that, because the voltage of the electrical signal may be driven by a voltage rail $V_{DD}$ having an electrical potential substantially higher than the maximum voltage of the received bits, the voltage swing of the electrical signal may also be substantially higher than the voltage swing of any of the received bits.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A data driver, comprising:
   pre-driver circuitry configured to:
      receive a plurality of first voltages corresponding to respective bits of a digital codeword, each of the first voltages having one of a first voltage value or a ground potential based on a value of the corresponding bit; and
      drive a plurality of second voltages onto respective bit lines by switchably coupling each of the bit lines to ground or a voltage rail based at least in part on the voltage values of the plurality of first voltages, wherein the voltage rail is configured to provide a second voltage value that is greater than the first voltage value; and
   a digital-to-analog converter (DAC) coupled to the bit lines and configured to convert the plurality of second voltages to an electrical signal, wherein the electrical signal is an analog representation of the digital codeword.

2. The data driver of claim 1, wherein the electrical signal is a single-ended signal having a voltage swing greater than the first voltage value.

3. The data driver of claim 1, wherein the second voltage value is double the first voltage value.

4. The data driver of claim 1, wherein the pre-driver circuitry is configured to:
   ground one or more of the bit lines in response to receiving a corresponding one or more of the first voltages at the ground potential; and
   couple one or more of the bit lines to the voltage rail in response to receiving a corresponding one or more of the first voltages at the first voltage value.

5. The data driver of claim 4, wherein the first switch is configured to:
   couple the respective bit line to the voltage rail when the LS voltage is at the second voltage value; and
   decouple the respective bit line from the voltage rail when the LS voltage is at the first voltage value.

6. The data driver of claim 4, wherein the second switch is configured to:
   couple the respective bit line to ground when the first voltage is at the ground potential; and
   decouple the respective bit line from ground when the first voltage is at the first voltage value.

7. The data driver of claim 1, wherein the pre-driver circuitry comprises a plurality of slices configured to receive the plurality of first voltages, respectively, and wherein each of the slices is coupled to a respective one of the bit lines and comprises:
   a level shifter configured to generate a level-shifted (LS) voltage based on the received first voltage, the LS voltage having one of the first voltage value or the second voltage value depending on the voltage value of the first voltage;
   a first switch configured to switchably couple the respective bit line to the voltage rail based on the voltage value of the LS voltage; and
   a second switch configured to switchably couple the respective bit line to ground based on the voltage value of the first voltage.

8. The data driver of claim 7, wherein the level shifter is configured to:
   drive the LS voltage to the first voltage value when the first voltage is at the ground potential; and
   drive the LS voltage to the second voltage value when the first voltage is at the first voltage value.

9. The data driver of claim 1, wherein one or more most significant bits (MSBs) of the digital codeword are thermometer coded and one or more least significant bits (LSBs) of the digital codeword are binary coded.

10. The data driver of claim 1, wherein the second voltage value is selected based at least in part on one or more properties of an electro-optic modulator (EOM) coupled to the data driver and configured to convert the electrical signal to an optical signal for transmission over an optical medium.

11. A method of digital-to-analog conversion, comprising:
receiving a plurality of first voltages corresponding to respective bits of a digital codeword, each of the first voltages having one of a first voltage value or a ground potential based on a value of the corresponding bit;
driving a plurality of second voltage onto respective bit lines by switchably coupling each of the bit lines to ground or a voltage rail based at least in part on the voltage values of the plurality of first voltages, wherein the voltage rail is configured to provide a second voltage value that is greater than the first voltage value; and
converting the plurality of second voltages to an electrical signal, wherein the electrical signal is an analog representation of the digital codeword.

12. The method of claim 11, wherein the electrical signal is a single-ended signal having a voltage swing greater than the first voltage value.

13. The method of claim 11, wherein the driving comprises:
grounding one or more of the bit lines in response to receiving a corresponding one or more of the first voltages at the ground potential; and
coupling one or more of the bit lines to the voltage rail in response to receiving a corresponding one or more of the first voltages at the first voltage value.

14. The method of claim 11, wherein the driving comprises, for each of the first voltages:
generating a level-shifted (LS) voltage based on the first voltage, the LS voltage having one of the first voltage value or the second voltage value depending on the voltage value of the first voltage;
driving a first switch using the LS voltage, wherein the first switch is configured to switchably couple a respective one of the bit lines to the voltage rail based on the voltage value of the LS voltage; and
driving a second switch using the first voltage, wherein the second switch is configured to switchably couple the respective bit line to ground based on the voltage value of the first voltage.

15. The method of claim 14, wherein the generating comprises:
driving the LS voltage to the first voltage value when the first voltage is at the ground potential; and
driving the LS voltage to the second voltage value when the first voltage is at the first voltage value.

16. The method of claim 14, wherein the first switch is configured to:
couple the respective bit line to the voltage rail when the LS voltage is at the second voltage value; and
decouple the respective bit line from the voltage rail when the LS voltage is at the first voltage value.

17. The method of claim 14, wherein the second switch is configured to:
couple the respective bit line to ground when the first voltage is at the ground potential; and
decouple the respective bit line from ground when the first voltage is at the first voltage value.

18. The method of claim 11, further comprising:
converting the electrical signal to an optical signal for transmission over an optical medium, wherein the second voltage value is selected based at least in part on the conversion from an electrical domain to an optical domain.

19. The electro-optical transmitter of claim 18, wherein the data driver comprises a plurality of slices configured to receive the plurality of first voltages, respectively, and wherein each of the slices is coupled to a respective one of the bit lines and comprises:
a level shifter configured to generate a level-shifted (LS) voltage based on the received first voltage, the LS voltage having one of the first voltage value or the second voltage value depending on the voltage value of the first voltage;
a first switch configured to switchably couple the respective bit line to the voltage rail based on the voltage value of the LS voltage; and
a second switch configured to switchably couple the respective bit line to ground based on the voltage value of the first voltage.

20. An electro-optical transmitter, comprising:
a data driver configured to:
receive a plurality of first voltages corresponding to respective bits of a digital codeword, each of the first voltages having one of a first voltage value or a ground potential based on a value of the corresponding bit;
drive a plurality of second voltages onto respective bit lines by switchably coupling each of the bit lines to ground or a voltage rail based at least in part on the voltage values of the plurality of first voltages, wherein the voltage rail is configured to provide a second voltage value that is greater than the first voltage value; and
convert the plurality of second voltages to an electrical signal, wherein the electrical signal is a single-ended signal having a voltage swing greater than the first voltage value; and
an electro-optic modulator (EOM) configured to receive the electrical signal via an electrical medium and convert the electrical signal to an optical signal for transmission over an optical medium.

* * * * *